(12) United States Patent
Kuo et al.

(10) Patent No.: US 10,461,035 B2
(45) Date of Patent: Oct. 29, 2019

(54) SEMICONDUCTOR PACKAGE STRUCTURE

(71) Applicants: Industrial Technology Research Institute, Hsinchu (TW); Intellectual Property Innovation Corporation, Hsinchu (TW)

(72) Inventors: Shu-Wei Kuo, Hsinchu County (TW); Wei-Yuan Cheng, Hsinchu County (TW); Chen-Tsai Yang, Taoyuan (TW); Jie-Mo Lin, Taichung (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 0 days.

(21) Appl. No.: 15/849,593

(22) Filed: Dec. 20, 2017

(65) Prior Publication Data

US 2019/0088600 A1 Mar. 21, 2019

(30) Foreign Application Priority Data

Sep. 15, 2017 (TW) .............................. 106131708 A

(51) Int. Cl.
*H01L 23/538* (2006.01)
*H01L 23/14* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
None
See application file for complete search history.

(56) References Cited

U.S. PATENT DOCUMENTS 5,440,239 A 8/1995 Zappella et al.
5,872,399 A 2/1999 Lee
(Continued)

FOREIGN PATENT DOCUMENTS

CN 1667820 9/2005
CN 101681963 3/2010
(Continued)

OTHER PUBLICATIONS

"Office Action of Taiwan Counterpart Application," dated Jan. 5, 2018, p. 1-p. 8.

*Primary Examiner* — Long Pham
(74) *Attorney, Agent, or Firm* — JCIPRNET

(57) ABSTRACT

A semiconductor package structure includes a redistribution structure, a chip, an upper dielectric layer, a plurality of conductive members and an encapsulation layer. The redistribution structure includes a redistribution layer and a first dielectric layer disposed on the redistribution layer. The upper dielectric layer is disposed between the chip and the first dielectric layer of the redistribution structure, wherein the upper dielectric layer and the first dielectric layer are organic materials. A plurality of conductive members is disposed between the redistribution layer and the chip. Each conductive member has a first end adjacent to the chip and a second end adjacent to the redistribution structure, wherein the first end of said each conductive member contacts with the upper dielectric layer and the second end of said each conductive member contacts with the first dielectric layer.

17 Claims, 5 Drawing Sheets

(51) Int. Cl.
*H01L 23/15* (2006.01)
*H01L 23/31* (2006.01)
*H01L 23/00* (2006.01)
*H01L 21/48* (2006.01)
*H01L 21/56* (2006.01)
*H01L 23/498* (2006.01)

(52) U.S. Cl.
CPC .......... *H01L 21/565* (2013.01); *H01L 23/145* (2013.01); *H01L 23/15* (2013.01); *H01L 23/3114* (2013.01); *H01L 23/49822* (2013.01); *H01L 23/5383* (2013.01); *H01L 23/5386* (2013.01); *H01L 23/562* (2013.01); *H01L 24/19* (2013.01); *H01L 24/20* (2013.01); *H01L 23/3121* (2013.01); *H01L 24/05* (2013.01); *H01L 24/13* (2013.01); *H01L 24/16* (2013.01); *H01L 2221/68345* (2013.01); *H01L 2221/68359* (2013.01); *H01L 2224/0401* (2013.01); *H01L 2224/05073* (2013.01); *H01L 2224/05166* (2013.01); *H01L 2224/05647* (2013.01); *H01L 2224/131* (2013.01); *H01L 2224/13147* (2013.01); *H01L 2224/214* (2013.01); *H01L 2924/35121* (2013.01); *H01L 2924/381* (2013.01)

(56) References Cited

U.S. PATENT DOCUMENTS

| | | |
|---|---|---|
| 6,179,198 B1 | 1/2001 | Eifuku et al. |
| 6,268,739 B1 | 7/2001 | Bernier et al. |
| 6,518,675 B2 | 2/2003 | Kim et al. |
| 6,586,275 B2 | 7/2003 | Kim et al. |
| 6,836,018 B2 | 12/2004 | Kim et al. |
| 7,259,455 B2 | 8/2007 | Seto |
| 7,393,419 B2 | 7/2008 | Sachdev et al. |
| 7,446,405 B2 | 11/2008 | Kim et al. |
| 8,048,766 B2 | 11/2011 | Joly et al. |
| 8,269,337 B2 | 9/2012 | Hu et al. |
| 8,373,282 B2 | 2/2013 | Chen et al. |
| 8,779,588 B2 | 7/2014 | Yu et al. |
| 8,928,141 B2 | 1/2015 | Souriau |
| 9,147,661 B1 | 9/2015 | Kwon et al. |
| 9,406,662 B2 | 8/2016 | Marion et al. |
| 9,520,381 B2 | 12/2016 | Higuchi |
| 2002/0016022 A1 | 2/2002 | Shintani |
| 2002/0084528 A1 | 7/2002 | Kim et al. |
| 2002/0093096 A1 | 7/2002 | Tago et al. |
| 2002/0104873 A1 | 8/2002 | Lee et al. |
| 2003/0034565 A1 | 2/2003 | Lan et al. |
| 2003/0109077 A1 | 6/2003 | Kim et al. |
| 2004/0266066 A1 | 12/2004 | Wang |
| 2005/0099783 A1* | 5/2005 | Alcoe ............... H01L 23/49822 361/748 |
| 2006/0091504 A1 | 5/2006 | Kang et al. |
| 2006/0281309 A1 | 12/2006 | Trezza |
| 2007/0152331 A1 | 7/2007 | Kang et al. |
| 2008/0146071 A1 | 6/2008 | Davoine et al. |
| 2011/0094789 A1 | 4/2011 | Marion et al. |
| 2011/0227216 A1 | 9/2011 | Tseng et al. |
| 2012/0146216 A1* | 6/2012 | Kang .................. H01L 21/486 257/737 |
| 2012/0178218 A1 | 7/2012 | Bauer et al. |
| 2013/0270719 A1 | 10/2013 | Malatkar et al. |
| 2015/0380395 A1 | 12/2015 | Marion et al. |
| 2016/0064254 A1 | 3/2016 | Hu |
| 2016/0141255 A1 | 5/2016 | Lu et al. |
| 2017/0351895 A1* | 12/2017 | Lundahl ............... G06K 9/0002 |

FOREIGN PATENT DOCUMENTS

| | | |
|---|---|---|
| JP | 2007214563 | 8/2007 |
| JP | 4346264 | 10/2009 |
| KR | 100418600 | 2/2004 |
| KR | 100713928 | 4/2007 |
| TW | I279912 | 4/2007 |
| TW | 200839999 | 10/2008 |
| TW | 201005893 | 2/2010 |
| TW | 201133726 | 10/2011 |
| TW | 201250961 | 12/2012 |
| TW | 201714267 | 4/2017 |
| TW | I584428 | 5/2017 |

\* cited by examiner

SEMICONDUCTOR PACKAGE STRUCTURE

CROSS-REFERENCE TO RELATED APPLICATION

This application claims the priority benefits of Taiwan application serial no. 106131708, filed on Sep. 15, 2017. The entirety of the above-mentioned patent applications is hereby incorporated by reference.

TECHNICAL FIELD

The technical field relates to a semiconductor package structure.

BACKGROUND

In view of the lightweight, meticulous and multi-functional requirements of the mobile devices and the Internet of Things (IoT) products in the future, functional integration of key components of related integrated circuit (IC) functions is increased. The quantity of the Input/Output (I/O) in a wafer increases significantly with the refinement of the chip process line, and the traditional bridge IC/PCB packaging integration technology has not been used enough. The wafer package structure of high resolution, low cost and low stress will be the industry demand.

The reliability of the wafer package structure has been an important issue for the overall performance of the wafer. When the density distribution of the Input/Output metal pad is getting higher and higher in the recent packaging process, the stress easily focuses around the conductive bumps. When the wafer package structure is bent, the stress will focus on the corner of the conductive bump. The wafer package structure will be broken and the reliability will fail. In addition, during the removal process of the wafer package module, it is also easy to increase the risk of delamination of the package structure due to the stress being over concentrated on the conductive bumps.

Accordingly, how to solve the existing stress uneven distribution leading poor reliability of the chip package structure is the current issue.

SUMMARY

According to an embodiment of the disclosure, a semiconductor package structure is provided. The semiconductor package structure includes a redistribution structure, a chip, an upper dielectric layer, a plurality of conductive members, and an encapsulation layer. The redistribution structure includes a redistribution layer and a first dielectric layer disposed on the redistribution layer. The chip is disposed the on the redistribution structure. The upper dielectric layer is disposed between the chip and the first dielectric layer of the redistribution structure, wherein the upper dielectric layer and the first dielectric layer are organic materials. A plurality of conductive members is disposed between the redistribution layer and the chip. Each conductive member has a first end adjacent to the chip and a second end adjacent to the redistribution structure, wherein the first end of said each conductive member contacts with the upper dielectric layer and the second end of said each conductive member contacts with the first dielectric layer. The encapsulation layer is filled between the redistribution structure, the chip and the plurality of conductive members.

The foregoing will become better understood from a careful reading of a detailed description provided herein below with appropriate reference to the accompanying drawings.

DETAILED DESCRIPTION OF DISCLOSED EMBODIMENTS

Figure 1A:
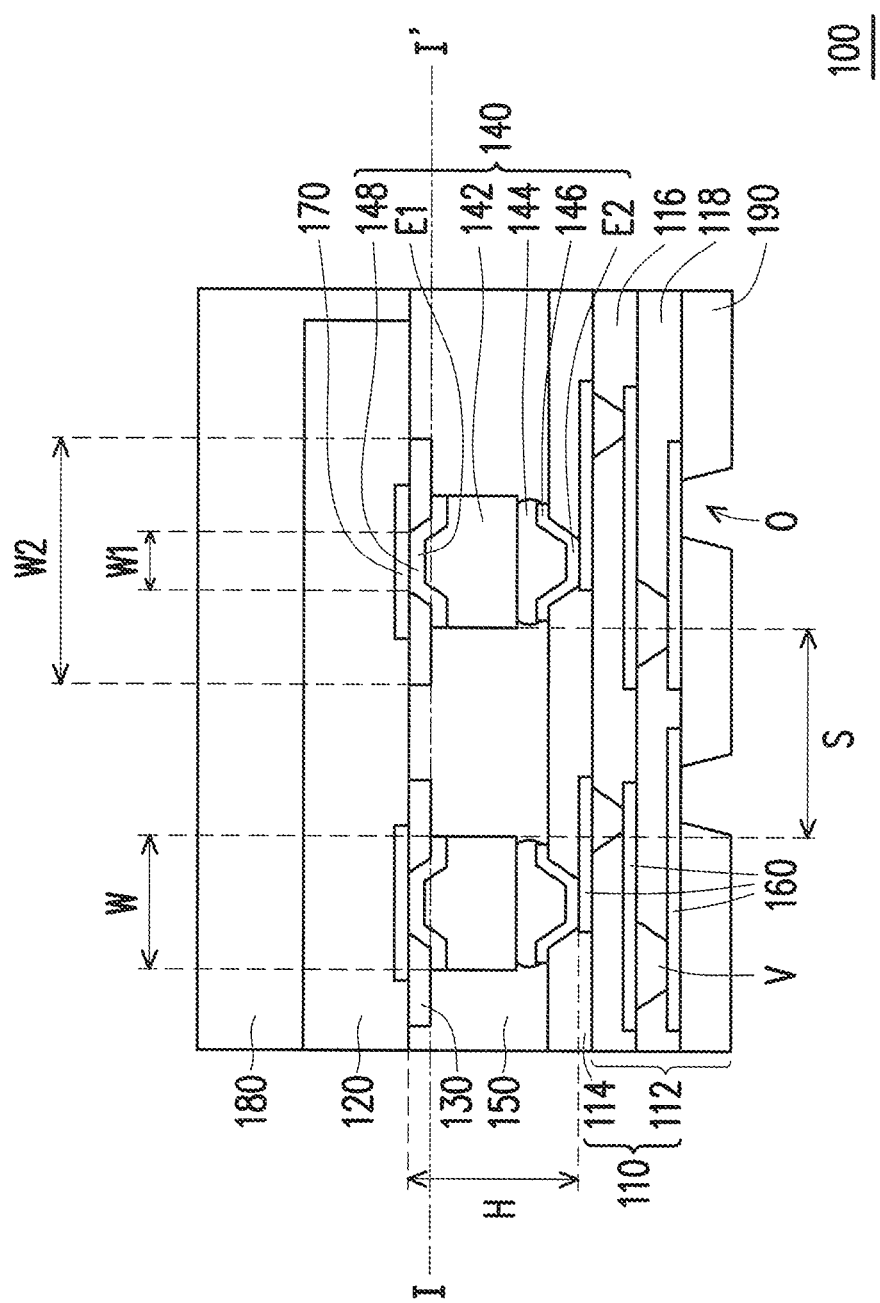
FIG. 1A is a schematic cross-sectional diagram of a semiconductor package structure according to an embodiment of the disclosure.

Below, exemplary embodiments will be described in detail with reference to accompanying drawings so as to be easily realized by a person having ordinary knowledge in the art. In the exemplary embodiments, the wording used to indicate directions, such as "up," "down," "front," "back," "left," and "right," merely refers to directions in the accompanying drawings. The directional wording does not limit the scope of the disclosure. The inventive concept may be embodied in various forms without being limited to the exemplary embodiments set forth herein. Descriptions of well-known parts are omitted for clarity, and like reference numerals refer to like elements throughout.

FIG. 1A is a schematic cross-sectional diagram of a semiconductor package structure according to an embodiment of the disclosure. In the embodiment, a semiconductor package structure 100 comprises a redistribution structure 110, a chip 120, an upper dielectric layer 130, and a plurality of conductive members 140. The redistribution structure 110 includes a redistribution layer 112 and a first dielectric layer 114 disposed on the redistribution layer 112. The chip 120 is disposed on the redistribution structure 110. The upper dielectric layer 130 is disposed between the chip 120 and the first dielectric layer 114 of the redistribution structure 110, wherein the upper dielectric layer 130 and the first dielectric layer 114 are organic materials. The organic materials may include Polyimide (PI), Polybenzoxazole (PBO), or benzocyclobutene polymer (BCB) or other suitable materials. The manufacturing method of the upper dielectric layer 130 and the first dielectric layer 114 may be a wet coating process such as the slit coating process or the spin coating process, a chemical vapor deposition process, or other applicable processes, or the combination thereof. The scope of the disclosure is not limited thereto.

A plurality of conductive members 140 are disposed between the redistribution layer 112 and the chip 120. Each conductive member 140 has a first end E1 adjacent to the chip 120 and a second end E2 adjacent to the redistribution structure 110. The first end E1 of each conductive member 140 contacts with the upper dielectric layer 130 and the second end E2 of each conductive member 140 contacts with the first dielectric layer 114. The semiconductor package structure 100 further includes an encapsulation layer 150 filled between the redistribution structure 110, the chip 120 and the plurality of conductive members 140. The material of the encapsulation layer 150 may be epoxy, Polymethylmethacrylate, other polymer or the combination thereof, but the scope of the disclosure is not limited thereto.

Each conductive member 140 further includes an upper metallurgical layer 148 having the first end E1, a conductive pillar 142, a solder ball 144, and a lower metallurgical layer 146 having the second end E2. The solder ball 144 is disposed between the conductive pillar 142 and the lower metallurgical layer 146. Two opposite ends of the solder ball 144 contacts with the conductive pillar 142 and the lower metallurgical layer 146, respectively. The first end E1 of the upper metallurgical layer 148 contacts with one of metal pads 170, that is, the upper metallurgical layer 148 contacts with the upper dielectric layer 130 and the metal pad 170 simultaneously, and the upper metallurgical layer 148 is electrically connected to the chip 120 through the metal pad 170. The second end E2 of the conductive member 140 contacts with the first dielectric layer 114 and the redistribution layer 112 simultaneously, and the conductive member 140 is electrically connected to the redistribution layer 112. The material of the solder ball 144 of the conductive member 140 may be a tin-silver alloy or a tin-lead alloy or the like. The material of the lower metallurgical layer 146 and the upper metallurgical layer 148 may be the same as the material of the Under Bump Metallurgy, for example, a copper layer, or a titanium layer and a seed layer (the seed layer may be made of copper or copper alloy).

The redistribution structure 110 includes a plurality of conductive vias V. The redistribution layer 112 further comprises a plurality of patterned circuit layers 160, an under bump supporting layer 190 and plurality of dielectric layers. Please refer to FIG. 1A, the plurality of dielectric layers includes a second dielectric layer 116, and a third dielectric layer 118, wherein the second dielectric layer 116 contacts with the first dielectric layer 114, and the third dielectric layer 118 is the farthest dielectric layer from the conductive members 140. The plurality of patterned circuit layers 160 are stacked alternately with the first dielectric layer 114, the second dielectric layer 116, and the third dielectric layer 118, and the plurality of patterned circuit layers 160 are electrically connected to the conductive members 140 through the plurality of conductive vias V. The under bump supporting layer 190 is disposed under the third dielectric layer 118.

In the packaging process, the under bump supporting layer 190 may be formed on a carrier (not shown). In the embodiment, the materials of the under bump supporting layer 190 include an organic polymer material, an inorganic polymer material, or an organic and inorganic mixed polymer material, and the thickness of the under bump supporting layer 190 is between about 1 micron and 50 microns. The patterned circuit layers 160 are formed, and stacked alternately with the first dielectric layer 114, the second dielectric layer 116, and the third dielectric layer 118, thereby forming the redistribution structure 110. In other words, the redistribution structure 110 includes the under bump supporting layer 190 and the patterned circuit layers 160, wherein the patterned circuit layers 160 are stacked alternately with the first dielectric layer 114, the second dielectric layer 116, and the third dielectric layer 118. After removing the carrier, the under bump supporting layer 190 having a plurality of openings O may be formed. Thus, in the packaging process of the semiconductor package structure 100, in which the redistribution structure 110 is formed prior to the disposition of the chip 120, the under bump supporting layer 190 having the plurality of openings O may be formed when the carrier is removed. So that the semiconductor package structure 100 may provide enough structural supporting and help the position alignment for the solder balls. This increases the reliability of the semiconductor package structure 100. In addition, the under bump supporting layer 190 prevents the moisture from entering the semiconductor package structure 100, thereby increasing the ability of the semiconductor package structure 100 to block the moisture and/or the ability of the semiconductor package structure 100 of oxidation resistance.

In one embodiment of the disclosure, the semiconductor package structure 100 further includes a top encapsulation 180 covering the chip 120. The material of the top encapsulation 180 may be the Epoxy Molding Compound, but not limited thereto. In one embodiment of the disclosure, the spacing S between every two adjacent conductive members 140 of the plurality of conductive members 140 is between about 10 microns and 30 microns.

In one embodiment of the semiconductor package structure 100 in the disclosure, Young's modulus of the upper dielectric layer 130 is A, Young's modulus of the encapsulation layer 150 is B, Young's modulus of the second dielectric layer 116 is C, and Young's modulus of the first dielectric layer 114 is D, wherein the semiconductor package structure 100 satisfies the following inequalities:

$A < B \leq C$; and $D < B \leq C$.

In another embodiment of the disclosure, the semiconductor package structure 100 further satisfies the following inequality, in addition to satisfying the aforementioned inequality:

$D \leq A < 9$ GPa.

Wherein the materials of the first dielectric layer 114 and the upper dielectric layer 130 are organic materials.

In one another embodiment of the disclosure, the semiconductor package structure 100 further satisfies the following inequality, in addition to satisfying the aforementioned inequality:

$D \leq A < 5$ GPa.

Wherein the materials of the first dielectric layer 114 and the upper dielectric layer 130 are organic materials.

In the embodiment, the upper dielectric layer 130 and the first dielectric layer 114 are disposed around the first end E1 and the second end E2 of the conductive member 140, respectively, wherein Young's modulus of the upper dielectric layer 130 and Young's modulus of the first dielectric layer 114 are less than Young's modulus of the encapsulation layer 150, so that the stress at the corner of the metal pad 170 and the patterned circuit layers 160 near the second end E2 of the conductive member 140 is greatly reduced. The probability of breakage at the corner of the conductive member 140 is reduced and the reliability of the element may be improved.

In another embodiment of the disclosure, the semiconductor package structure 100 further satisfies the following inequality, in addition to satisfying the aforementioned inequalities:

$A/B < 1$; and $D/B < 1$.

In yet another embodiment of the disclosure, the semiconductor package structure 100 further satisfies the following inequalities:

$A < 9$ GPa; and $D < 9$ Gpa.

Wherein the materials of the first dielectric layer 114 and the upper dielectric layer 130 are organic materials.

In another embodiment of the disclosure, Young's modulus of the third dielectric layer 118 is F, and Young's modulus of the second dielectric layer 116 is C, wherein the semiconductor package structure 100 further satisfies the following inequality:

$$F \leq C.$$

The material of the second dielectric layer 116 may be an inorganic material, such as silicon dioxide, silicon nitride, silicon oxynitride, polysiloxane, polysiloxazane or polysilazane, but the scope of the disclosure is not limited thereto. In another embodiment of the disclosure, Young's modulus of the encapsulation layer 150 of the semiconductor package structure 100 is in a range of 5 GPa to 15 GPa. In another embodiment of the disclosure, Young's modulus of the encapsulation layer 150 of the semiconductor package structure 100 is in a range of 7 GPa to 12 GPa.

Figure 1B:
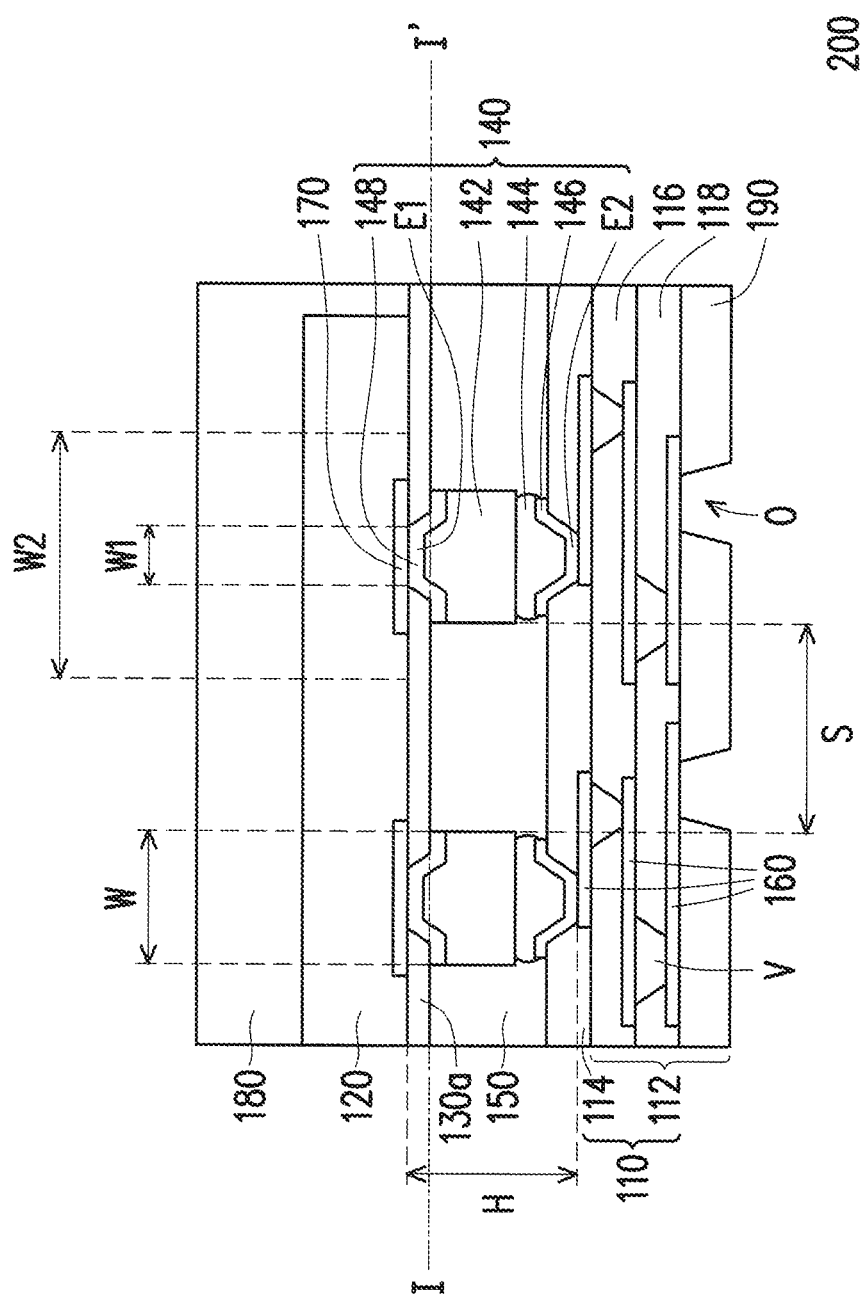
FIG. 1B is a schematic cross-sectional diagram of a semiconductor package structure according to another embodiment of the disclosure.

FIG. 1B is a schematic cross-sectional diagram of a semiconductor package structure according to another embodiment of the disclosure. The semiconductor package structure 200 of FIG. 1B is similar to the semiconductor package structure 100 of FIG. 1A. The difference is that the pattern of the upper dielectric layer 130a in FIG. 1B is a continuous pattern, while the pattern of the upper dielectric layer 130 in FIG. 1A is a discontinuous pattern.

Figure 2A:
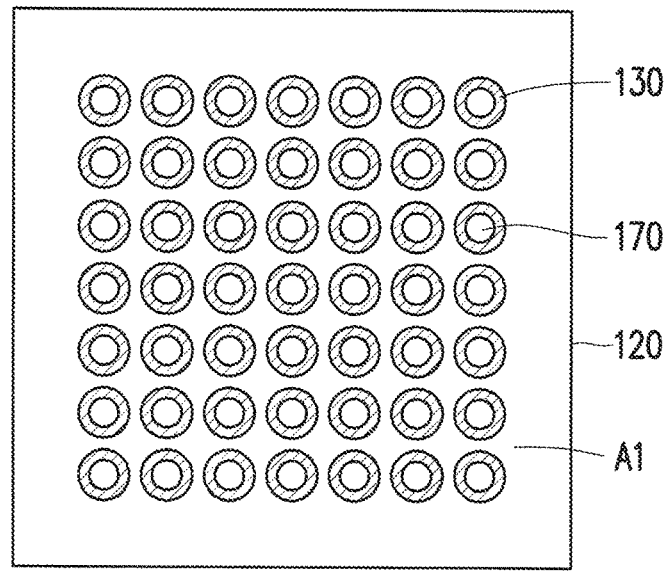
FIG. 2A is a partial top view of FIG. 1A along line I-I'.
Figure 2B:
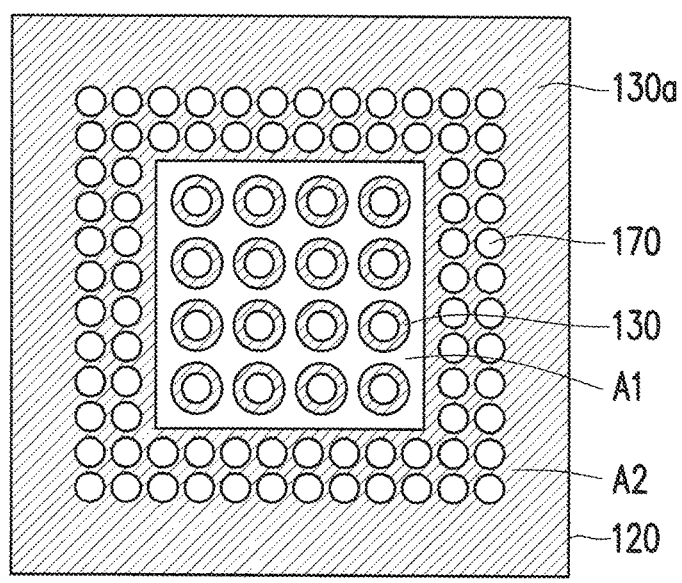
FIG. 2B is a partial top view of FIG. 1B along line I-I'.

FIG. 2A is a partial top view of FIG. 1A along line I-I'. FIG. 2B is a partial top view of FIG. 1B along line I-I'. The semiconductor package structure 200 of FIG. 1B is a partial schematic diagram, that is, the continuous pattern of the upper dielectric layer 130a in FIG. 1B. Please refer to FIG. 2A and FIG. 2B. The upper dielectric layer 130 and the metal pads 170 are disposed on the chip 120. Please refer to FIG. 2A, the upper dielectric layer 130 encircles the metal pads 170. Due to the metal pads 170 of the chip 120 are loosely arranged and the pattern of the upper dielectric layer 130 is a discontinuous pattern A1 between any two adjacent metal pads 170. Please refer to FIG. 2B, there are two kinds of distribution of the metal pads 170, one is loose and the other is dense. In the loose distribution area of the metal pads 170, the pattern of the upper dielectric layer 130a may be a discontinuous pattern A1. In the dense distribution area of the metal pads 170, the pattern of the upper dielectric layer 130a may be a continuous pattern A2. In another embodiment, in the loose distribution area of the metal pads 170, the pattern of the upper dielectric layer 130a may be the continuous pattern A2. The pattern arrangement of the upper dielectric layer 130a may be designed according to the density and the arrangement of the metal pads 170.

Please refer to FIG. 1 and FIG. 2A. In one embodiment, a width W2 of the pattern in the upper dielectric layer 130 corresponding to the first end E1 of the pattern is twice greater than the width W1 of an opening of one metal pad 170.

In one embodiment of the disclosure. Please refer to FIG. 1. A width of the conductive member 140 is W, a height of the conductive member 140 is H, wherein the semiconductor package structure 100 satisfies the following inequality:

$$W/H < 1.$$

If the semiconductor package structure 100 satisfies the aforementioned inequality, it is possible to improve the uniformity of the encapsulation layer 150 filled between the redistribution structure 110, the chip 120, and the plurality of conductive members 140, so that the bubbles are not produced. Under the fine pitch trend of the semiconductor package structure, the encapsulation layer may have fewer bubbles and a better reliability.

Figure 3A:
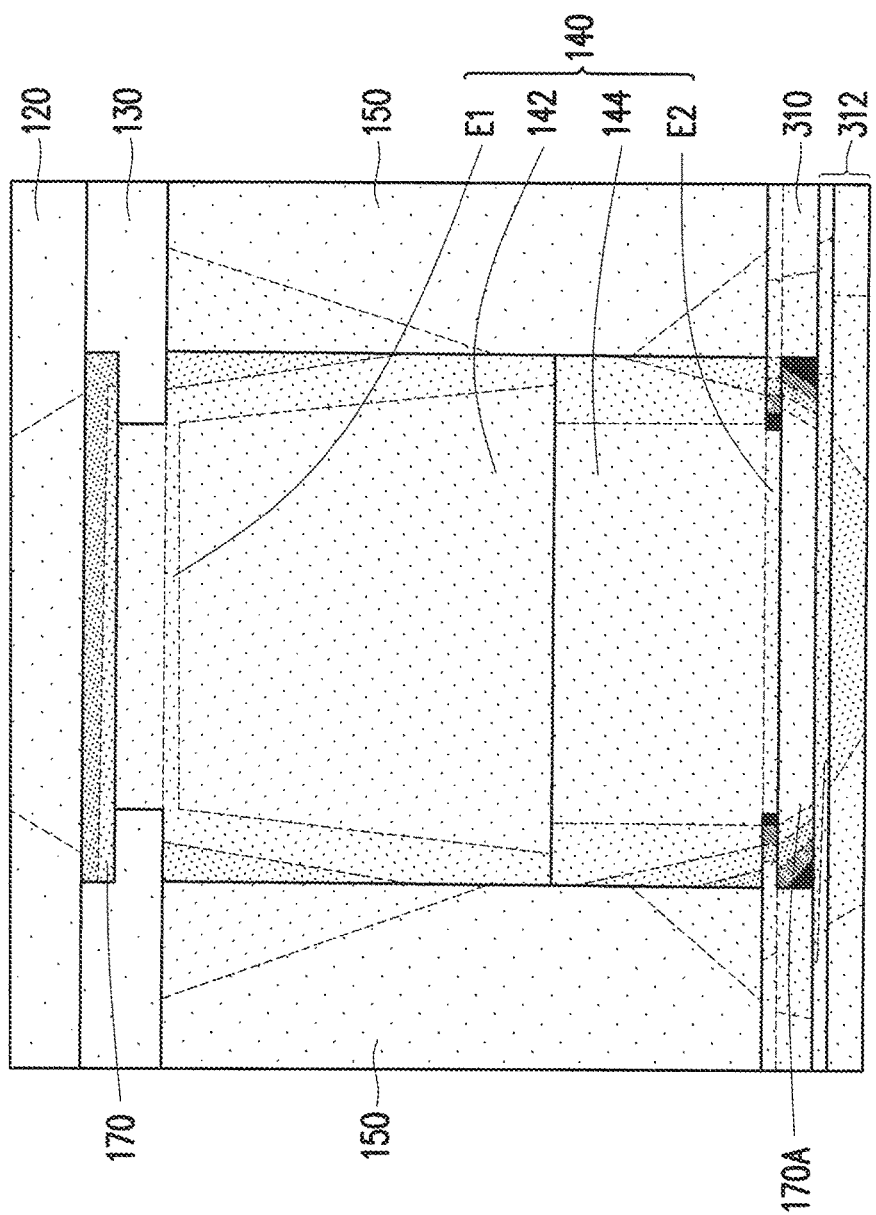
FIG. 3A is a schematic diagram of stress distribution simulations of a comparative example of a semiconductor package structure according to an embodiment of the disclosure.
Figure 3B:
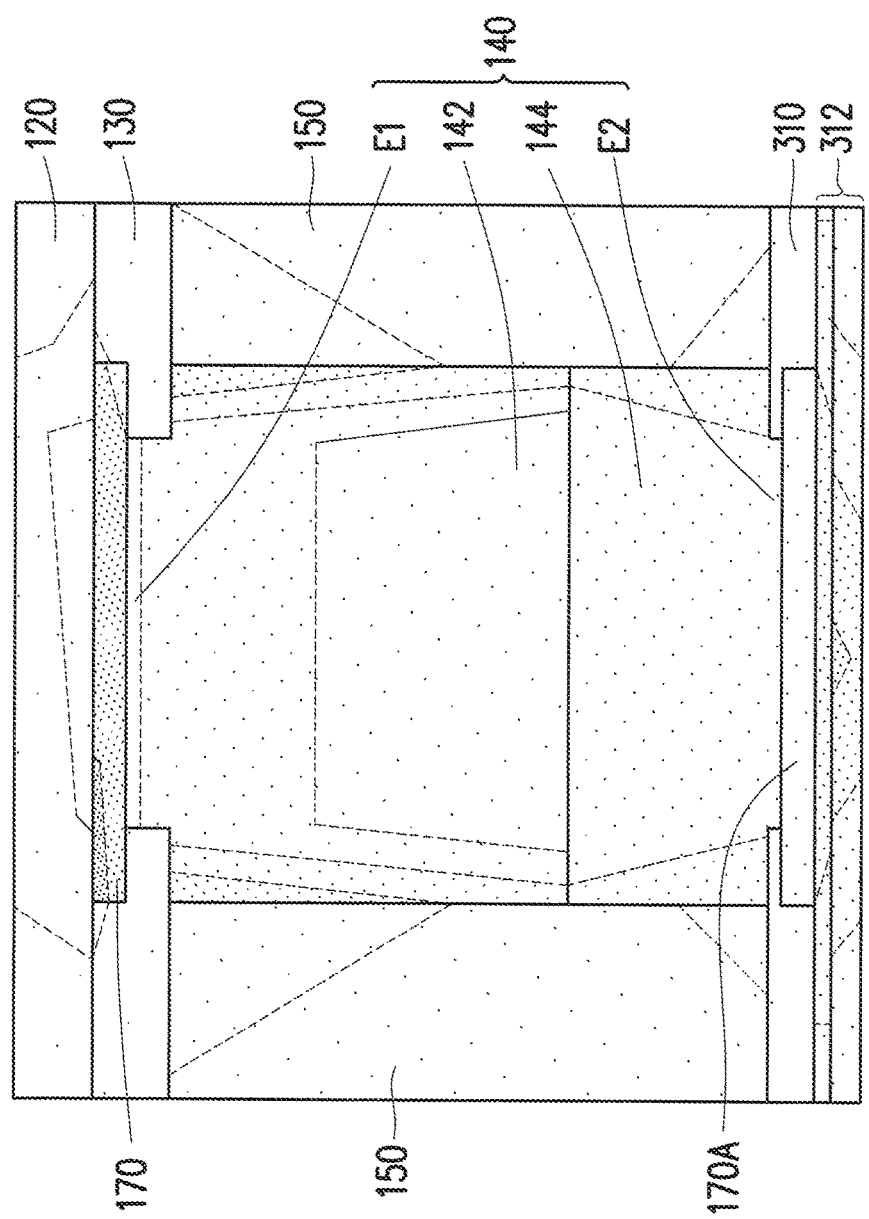
FIG. 3B is a schematic diagram of stress distribution simulations of an experimental example of a semiconductor package structure according to an embodiment of the disclosure.

FIG. 3A is a diagram of stress distribution simulations of a comparative example of a semiconductor package structure according to an embodiment of the disclosure. FIG. 3B is a schematic diagram of stress distribution simulations of an experimental example of a semiconductor package structure according to an embodiment of the disclosure. To demonstrate that the semiconductor package structure of the disclosure may improve the stress distribution, comparative examples and experiment examples are described below. Please refer to FIG. 3A and FIG. 3B. The semiconductor package structure of the comparative example in FIG. 3A and the semiconductor package structure of the experimental example in FIG. 3B are similar to the semiconductor package structure 100 in FIG. 1A. The size of the simulated structure of FIG. 3A and the size of the simulated structure of FIG. 3B are the same. The width W of the conductive member 140 is 55 μm, the height H is 60 μm, and the space S between two adjacent conductive members 140 is 25 μm. The material of the upper dielectric layer 130 on the conductive member 140 is polyimide. Each of the thickness of the dielectric layer 310 under the conductive member 140 and the thickness of the simulated equivalent layer 312 under the conductive member 140 is 5 μm. The simulated equivalent layer is to simulate the composite equivalent layer of the patterned circuit layers 160 and the dielectric layers of the redistribution structure 110. In order to simplify the drawings and to clearly represent the element of each layer, FIG. 3A and FIG. 3B only illustrate part of the simulated equivalent layer.

In the simulation experiment, the material of the metal pad 170 above the conductive member 140 is aluminum, gold, copper, lead, tin or a nickel-based alloy. The material of the metal pad 170A under the conductive member 140 is aluminum, gold, copper, lead, tin or a nickel-based alloy. The difference between the comparative example and the experimental example is that the material of the dielectric layer 310 of the comparative example in FIG. 3A is silicon dioxide and the material of the dielectric layer 310 of the experimental example in FIG. 3B is polyimide. The thickness of the simulated equivalent layer 312 in the comparative example and the thickness of the simulated equivalent layer 312 in the experimental example are the same.

Please refer to FIG. 3A and FIG. 3B. The denser the distribution of the mesh dot is, the stronger the stress is. Blocks of different stress are distinguished by a dotted line. The stress values in a same block are the same. The maximum stress value in the FIG. 3A is about 103 MPa, which is the stress value of the block with dark color located at the right corner of the metal pad 170A of FIG. 3A. Please refer to FIG. 3B. The overall stress distribution is uniform. The stress value of the metal pad 170A is reduced greatly, and the stress value is about 51 MPa. As shown from the aforementioned simulation results, when the material of the first dielectric layer is replaced, that is, the inorganic silicon dioxide is replaced with the organic polyimide, and other conditions are not changed, the stress of the metal pad 170A under the conductive member 140 can be reduced greatly and lower than the yield stress (the material of the metal pad is copper in the embodiment). In other words, the aforementioned structure may solve the over concentration problem of the stress, and improve the reliability of the semiconductor package structure.

When the space in the opening of the chip (for example, the space of two adjacent metal pads) is less than is 50 μm, and the tin solder ball is adopted to electrically connect the chip and the redistribution structure, it will be difficult to achieve good resolution and good yield. It will be a good choice by using the copper pillar as the conductive member and electrically connecting the chip and the redistribution structure. On the other hand, when the space of two adjacent conductive members near the redistribution structure is less than 30 μm, the inorganic dielectric layer (for example, silicon dioxide, silicon nitride, silicon oxynitride, polysiloxane, polysiloxazane or polysilazane) is adopted by the redistribution layer for supporting. Good resolution and good reliability may be achieved by accompanying with the copper pillar, and further accompanying with the organic dielectric layer of low Young's modulus at the two ends of the conductive member, it may greatly reduce the stress around the metal pad under the conductive member, and lower the possibility of breaking the corner of the conductive member and increase the reliability of the chip package structure.

According to the various embodiments described above, the disclosed semiconductor package structure includes a plurality of conductive members, and an organic upper dielectric layer and an organic first dielectric layer are disposed at both ends of each conductive member. It may greatly reduce the stress around the metal pad under the conductive member, and lower the possibility of breaking the corner of the conductive member. The flexibility and the reliability of the chip package structure may be increased. The semiconductor package structure according to the embodiments of the disclosure has the second dielectric layer with an inorganic material, may achieve fine pitch and may be applied to the package products of the semiconductor chip that require high density or higher number of pins.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A semiconductor package structure, comprising:
   a redistribution structure comprising a redistribution layer and a first dielectric layer disposed on the redistribution layer;
   a chip disposed the on the redistribution structure;
   an upper dielectric layer disposed between the chip and the first dielectric layer of the redistribution structure, wherein the upper dielectric layer and the first dielectric layer are organic materials;
   a plurality of conductive members disposed between the redistribution layer and the chip, with each conductive member having a first end adjacent to the chip and a second end adjacent to the redistribution structure;
   wherein the first end of said each conductive member contacts with the upper dielectric layer and the second end of said each conductive member contacts with the first dielectric layer; and
   an encapsulation layer filled between the redistribution structure, the chip and the plurality of conductive members,
   wherein Young's modulus of the upper dielectric layer is A, Young's modulus of the encapsulation layer is B, and Young's modulus of the first dielectric layer is D, wherein the semiconductor package structure satisfies the following inequalities:

$A/B<1$; and $D/B<1$.

2. The semiconductor package structure as recited in claim 1, wherein said each conductive member further comprises an upper metallurgical layer having the first end, a conductive pillar, a solder ball, and a lower metallurgical layer having the second end, the solder ball is disposed between the conductive pillar and the lower metallurgical layer, and two opposite ends of the solder ball contact with the conductive pillar and the lower metallurgical layer, respectively.

3. The semiconductor package structure as recited in claim 2, wherein the first end of the upper metallurgical layer contacts with a metal pad, and the upper metallurgical layer is electrically connected to the chip through the metal pad.

4. The semiconductor package structure as recited in claim 3, wherein a pattern of the upper dielectric layer comprises a discontinuous pattern.

5. The semiconductor package structure as recited in claim 4, wherein a width of the pattern in the upper dielectric layer corresponding to the first end of the pattern is twice greater than the width of an opening of the metal pad.

6. The semiconductor package structure as recited in claim 1, wherein a spacing between every two adjacent conductive members of the plurality of conductive members is between 10 microns and 30 microns.

7. The semiconductor package structure as recited in claim 1, wherein the redistribution layer comprises a second dielectric layer and a third dielectric layer, the second dielectric layer contacts with the first dielectric layer, and the third dielectric layer is the farthest dielectric layer from the plurality of conductive members.

8. The semiconductor package structure as recited in claim 7, wherein Young's modulus of the second dielectric layer is C, wherein the semiconductor package structure satisfies the following inequalities:

$A<B \leq C$; and $D<B \leq C$.

9. The semiconductor package structure as recited in claim 8, wherein the semiconductor package structure satisfies the following inequality:

$D \leq A < 9 GPa$.

10. The semiconductor package structure as recited in claim 8, wherein the semiconductor package structure satisfies the following inequality:

$D \leq A < 5 GPa$.

11. The semiconductor package structure as recited in claim 7, wherein Young's modulus of the third dielectric layer is F, Young's modulus of the second dielectric layer is C, wherein the semiconductor package structure satisfies the following inequality:

$F \leq C$.

12. The semiconductor package structure as recited in claim 7, wherein a material of the second dielectric layer comprises an inorganic material.

13. The semiconductor package structure as recited in claim 7, wherein the redistribution structure comprises a plurality of conductive vias, the redistribution layer further comprises a plurality of patterned circuit layers, the plurality of patterned circuit layers are alternately stacked with the first, the second and the third dielectric layers, and the plurality of patterned circuit layers are electrically connected to the conductive members through the plurality of conductive vias.

14. The semiconductor package structure as recited in claim 1, wherein the semiconductor package structure satisfies the following inequalities:

$A<9$ GPa; and $D<9$ GPa.

15. The semiconductor package structure as recited in claim 1, wherein Young's modulus of the encapsulation layer is in a range of 5 GPa to 15 GPa.

16. The semiconductor package structure as recited in claim 1, wherein a width of the conductive member is W, a height of the conductive member is H, wherein the semiconductor package structure satisfies the following inequality:

$W/H<1.$

17. The semiconductor package structure as recited in claim 1, wherein each of the conductive members and the encapsulation layer are disposed between the upper dielectric layer and the first dielectric layer.

* * * * *